(12) United States Patent
Gorbachov et al.

(10) Patent No.: US 10,505,501 B2
(45) Date of Patent: Dec. 10, 2019

(54) POWER AMPLIFIER WITH INPUT POWER PROTECTION CIRCUITS

(71) Applicant: Skyworks Solutions, Inc., Woburn, MA (US)

(72) Inventors: Oleksandr Gorbachov, Irvine, CA (US); Huan Zhao, Irvine, CA (US); Lisette L. Zhang, Irvine, CA (US); Lothar Musiol, Irvine, CA (US); Yongxi Qian, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/516,874

(22) PCT Filed: Jul. 9, 2014

(86) PCT No.: PCT/US2014/046043
§ 371 (c)(1),
(2) Date: Apr. 4, 2017

(87) PCT Pub. No.: WO2015/006505
PCT Pub. Date: Jan. 15, 2015

(65) Prior Publication Data
US 2017/0264253 A1    Sep. 14, 2017

Related U.S. Application Data

(60) Provisional application No. 61/844,232, filed on Jul. 9, 2013.

(51) Int. Cl.
*H03F 1/52*    (2006.01)
*H03F 1/02*    (2006.01)
(Continued)

(52) U.S. Cl.
CPC .......... *H03F 1/523* (2013.01); *H03F 1/0266* (2013.01); *H03F 1/56* (2013.01); *H03F 3/195* (2013.01);
(Continued)

(58) Field of Classification Search
CPC .......... H03G 3/20; H03G 3/30; H03G 3/3036; H03F 1/52; H03F 1/523
(Continued)

(56) References Cited

U.S. PATENT DOCUMENTS 3,909,742 A    9/1975    Cox et al.
5,119,042 A    6/1992    Crampton et al.
(Continued)

FOREIGN PATENT DOCUMENTS

AU    2012237343 A1    2/2013
CN    101917166 A    12/2010
(Continued)

OTHER PUBLICATIONS

International Search Report and Written Opinion for International Application No. PCT/US14/46043, dated Nov. 19, 2014, 18 pages.
(Continued)

*Primary Examiner* — Steven J Mottola
(74) *Attorney, Agent, or Firm* — Stetina Brunda Garred & Brucker

(57) ABSTRACT

An RF power amplifier circuit and input power limiter circuits are disclosed. A power detector generates a voltage output proportional to a power level of an input signal. There is a directional coupler with a first port connected to a transmit signal input, a second port connected to the input matching network, and a third port connected to the power detector. A first power amplifier stage with an input is connected to the input matching network and an output is connected to the transmit signal output. A control circuit
(Continued)

connected to the power detector generates a gain reduction signal based upon a comparison of the voltage output from the power detector to predefined voltage levels corresponding to specific power levels of the input signal. Overall gain of the RF power amplifier circuit is reduced based upon the gain reduction signal that adjusts the configurations of the circuit components.

20 Claims, 13 Drawing Sheets

(51) Int. Cl.
  *H03F 1/56* (2006.01)
  *H03F 3/195* (2006.01)
  *H03F 3/24* (2006.01)
  *H03G 3/30* (2006.01)

(52) U.S. Cl.
  CPC .......... *H03F 3/245* (2013.01); *H03G 3/3042* (2013.01); *H03F 2200/105* (2013.01); *H03F 2200/192* (2013.01); *H03F 2200/204* (2013.01); *H03F 2200/222* (2013.01); *H03F 2200/318* (2013.01); *H03F 2200/387* (2013.01); *H03F 2200/405* (2013.01); *H03F 2200/411* (2013.01); *H03F 2200/451* (2013.01); *H03F 2200/555* (2013.01); *H03F 2200/78* (2013.01); *H03G 2201/106* (2013.01)

(58) Field of Classification Search
  USPC .................................................. 330/136, 285
  See application file for complete search history.

(56) References Cited

U.S. PATENT DOCUMENTS

| | | | |
|---|---|---|---|
| 5,994,965 | A | 11/1999 | Davis et al. |
| 6,356,150 | B1 | 3/2002 | Spears et al. |
| 6,714,071 | B1 | 3/2004 | Page |
| 7,193,460 | B1 * | 3/2007 | Naik ............... H03G 3/3042 |
| | | | 330/136 |
| 7,345,534 | B2 | 3/2008 | Grebennikov |
| 7,440,733 | B2 * | 10/2008 | Maslennikov ........ H03F 1/0227 |
| | | | 330/10 |
| 7,477,085 | B2 | 1/2009 | Stevenson |
| 7,805,115 | B1 | 9/2010 | McMorrow et al. |
| 8,188,794 | B2 | 5/2012 | Lautzenhiser |
| 2003/0022646 | A1 | 1/2003 | Bult et al. |
| 2003/0038676 | A1 | 2/2003 | Mages |
| 2003/0179040 | A1 * | 9/2003 | Kossor ................ H03G 3/3042 |
| | | | 330/136 |
| 2004/0075494 | A1 | 4/2004 | Klomsdorf et al. |
| 2004/0152432 | A1 | 8/2004 | Gu |
| 2005/0140436 | A1 | 6/2005 | Ichitsubo |
| 2010/0033242 | A1 | 2/2010 | Krishnamurthy et al. |
| 2011/0156834 | A1 | 6/2011 | Bellantoni |
| 2012/0313709 | A1 | 12/2012 | Lautzenhiser |

FOREIGN PATENT DOCUMENTS

| | | |
|---|---|---|
| CN | 102217138 A | 10/2011 |
| CN | 102474275 A | 5/2012 |
| EP | 255424 A1 | 2/1988 |

OTHER PUBLICATIONS

Skyworks, "SKY77764 Power Amplifier Module for CDMA/ WCDMA/ HSDPA/ HSUPA/ HSPA+/ LTE—Bands III, IV, IX (1710 MHz-1785 MHz)", (datasheet), Sep. 19, 2012, [online], [retrieved on Oct. 30, 2014]. Retrieved from the Internet: <URL: http://www.rfmw.com/datasheets/skyworks/SKY77764-11/pdf; p. 1.
1st Chinese Office Action for Application Serial No. 201480049693.1 (dated Oct. 9, 2017).
2nd Chinese Office Action for Application Serial No. 201480049693.1 (dated May 9, 2018).
3rd Chinese Office Action for Application Serial No. 201480049693.1 (dated Nov. 9, 2018).
European Examination Report for Application Serial No. 14822702.8 (dated Aug. 11, 2017).
European Office Action for Application Serial No. 14822702.8 (dated Dec. 17, 2018).

* cited by examiner

POWER AMPLIFIER WITH INPUT POWER PROTECTION CIRCUITS

CROSS-REFERENCE TO RELATED APPLICATIONS

This application relates to and claims the benefit of U.S. Provisional Application No. 61/844,232, filed Jul. 9, 2013 and entitled POWER AMPLIFIER ARCHITECTURES WITH INPUT POWER PROTECTION CIRCUITS, the entirety of the disclosure of which is wholly incorporated by reference herein.

STATEMENT RE: FEDERALLY SPONSORED RESEARCH/DEVELOPMENT

Not Applicable

BACKGROUND

1. Technical Field

The present disclosure relates generally to radio frequency (RF) circuitry, and more particularly, to power amplifier architectures with input power protection circuits.

2. Related Art

Wireless communications systems find applications in numerous contexts involving information transfer over long and short distances alike, and there exists a wide range of modalities suited to meet the particular needs of each. Chief amongst these systems with respect to popularity and deployment is the mobile or cellular phone, and it has been estimated that there are over 4.6 billion subscriptions worldwide.

Generally, wireless communications involve a radio frequency (RF) carrier signal that is variously modulated to represent data, and the modulation, transmission, receipt, and demodulation of the signal conform to a set of standards for coordination of the same. Many different mobile communication technologies or air interfaces exist, including GSM (Global System for Mobile Communications), EDGE (Enhanced Data rates for GSM Evolution), and UMTS (Universal Mobile Telecommunications System). Various generations of these technologies exist and are deployed in phases, with one common third generation (3G) UMTS-related modality referred to as UMTS-FDD (frequency division duplexing) being W-CDMA (Wideband Code Division Multiplexing). More recently, 4G (fourth generation) technologies such as LTE (Long Term Evolution), which is based on the earlier GSM and UMTS standards, are being deployed. Besides mobile communications modalities such as these, various communications devices incorporate local area data networking modalities such as Wireless LAN (WLAN)/WiFi, ZigBee, and so forth. Along these lines, last-mile wireless broadband access technologies such as WiMAX (Worldwide Interoperability for Microwave Access) are also being implemented.

A fundamental component of any wireless communications system is the transceiver, that is, the combined transmitter and receiver circuitry. The transceiver encodes the data to a baseband signal and modules it with an RF carrier signal. Upon receipt, the transceiver down-converts the RF signal, demodulates the baseband signal, and decodes the data represented by the baseband signal. An antenna connected to the transmitter converts the electrical signals to electromagnetic waves, and an antenna connected to the receiver converts the electromagnetic waves back to electrical signals. Depending on the particulars of the communications modality, single or multiple antennas may be utilized.

Conventional transceivers typically do not generate sufficient power or have sufficient sensitivity for reliable communications standing alone. Thus, additional conditioning of the RF signal is necessary. The circuitry between the transceiver and the antenna that provide this functionality is referred to as the front end circuit, which is understood to be comprised of a power amplifier for increased transmission power, and/or a low noise amplifier for increased reception sensitivity. Each band or operating frequency of the communications system has a dedicated power amplifier and low noise amplifier tuned specifically to that operating frequency.

For a typical power amplifier utilized in WiFi applications, the gain requirement in the transmit mode is in the range of 25 dB to 30 dB. WiFi generally refers to multiple generations of local area networking standards designated as IEEE 802.11, each with different operating parameters. For instance, the maximum linear output power is approximately 18 dBm to 22 dBm in the 802.11g mode with an operating frequency of 2.5 GHz. The maximum linear output power in the 802.11a mode with an operating frequency of 5 GHz may be 17 dBm to 21 dBm. In light of these amplifier gain parameters and output power requirements, the transceiver output power is typically no more than −3 dBm.

However, in a calibration mode, the WiFi transceiver may increase the output power to as high as 10 dBm. The long-term reliability of the power amplifier may be compromised at these input power levels to the power amplifier, as there may be excessive voltage stress on the transistors thereof. The transistors in the last stages of the transmit chain are subject to the highest voltage stresses, as the previous stages amplify the input signal to levels high enough to cause damage. This is particularly problematic in CMOS (complementary metal oxide semiconductor) transistors that have lower breakdown voltage ratings compared to conventional BiCMOS or GaAs (gallium arsenide) technologies.

The transistors in the last amplifier stage are subject to additional stresses beyond that which is associated with the large input signal alone when the output is not perfectly matched to the 50 Ohm load. This may often be the case when the transceiver/front end circuitry is connected to automatic test equipment in a production line. This may result in the voltage level at the transistor terminals far exceeding that for reliable operation. Accordingly, there is a need in the art for improved architectures for protecting power amplifiers from input power overstress.

BRIEF SUMMARY

The present disclosure contemplates the mitigation of voltage and current over-stress of transistors utilized in RF power amplifiers. Generally, the circuit architectures allow control input power levels to be limited to an extent that reliable operation can be maintained. Additionally, protection against antenna VSWR variations is also envisioned. Various embodiments of power amplifier circuits and input power limiter circuit therefor are disclosed.

In accordance with one embodiment, the RF power amplifier circuit has a transmit signal input and a transmit signal output, in addition to an input matching network. Furthermore, there may be a power detector that generates a voltage output proportional to a power level of an input signal. The circuit may include a directional coupler with a first port connected to the transmit signal input, a second port connected to the input matching network, and a third port connected to the power detector. There may be a first power amplifier stage with an input connected to the input matching network and an output connected to the transmit signal output. The circuit may also include a control circuit that is connected to the power detector. A gain reduction signal may be generated by the control circuit based upon a comparison of the voltage output from the power detector to predefined voltage levels corresponding to specific power levels of the input signal. Overall gain of the RF power amplifier circuit may be reduced based upon the gain reduction signal.

Another embodiment contemplates an input power limiter circuit for a power amplifier with an input matching network and an output matching network. The circuit may include a plurality of chained amplifier stages each controlled by a bias circuit. A first one of the chained amplifier stages may be connected to the input matching network. A last one of the chained amplifier stages may be connected to the output matching network. Furthermore, the circuit may include a directional coupler that is connected to a transmit signal input and the input matching network. The circuit may also have a programmable attenuator that is connected to the directional coupler, and an input power detector connected to the programmable attenuator. There may be a comparator block that is connected to the input power detector and to each of the bias circuits of the chained amplifier stages. The bias circuits may decrease quiescent current of the respective chained amplifier stages in response to the input power detector triggering a high input power indicator.

In another embodiment, there is an input power limiter circuit for a power amplifier. The circuit may include an input directional coupler that is connected to a transmit signal input. There may also be a first power amplifier stage that is connected to the input directional coupler. An inter-stage matching network may be connected to the first power amplifier stage, and a second power amplifier stage may be connected to the inter-stage matching network. The circuit may also have an input power detector that generates a voltage output proportional to a power level of an input signal. Furthermore, the circuit may incorporate a switching transistor that is connected to the inter-stage matching network and defined by an on state and an off state. The inter-stage matching network may define a first impedance with the switching transistor in the off state and a second impedance with the switching transistor in the on state. The circuit may have a control circuit that is connected to the input power detector. The switching transistor may be set to the on state and the off state by the control circuit based at least in part on an evaluation of the voltage output from the input power detector. Overall gain of the first power amplifier stage and the second power amplifier stage may be reduced with the inter-stage matching network defining the second impedance.

Still another embodiment of the present disclosure is directed to an input power limiter circuit for a power amplifier. The circuit may have an input directional coupler that is connected to a transmit signal input. Additionally, there may be a first power amplifier stage that is connected to the input directional coupler. The circuit may have an adjustable attenuator connected to the input directional coupler and the first power amplifier stage, along with an input power detector that may generate a voltage output proportional to a power level of an input signal. There may be a control circuit that is connected to the input power detector and the adjustable attenuator. An attenuation factor thereof may be increased based at least in part on an evaluation of the voltage output from the input power detector exceeding a predefined threshold. Gain of the first power amplifier stage may be reduced in response to the increased attenuation factor.

The present disclosure will be best understood by reference to the following detailed description when read in conjunction with the drawings.

BRIEF DESCRIPTION OF THE DRAWINGS

These and other features and advantages of the various embodiments disclosed herein will be better understood with respect to the following description and drawings, in which.

Common reference numerals are used throughout the drawings and the detailed description to indicate the same elements.

DETAILED DESCRIPTION

The present disclosure encompasses various embodiments of RF power amplifier input power protection circuits. The detailed description set forth below in connection with the appended drawings is intended as a description of the several presently contemplated embodiments of the input power protection circuits, and is not intended to represent the only form in which the disclosed invention may be developed or utilized. The description sets forth the functions and features in connection with the illustrated embodiments. It is to be understood, however, that the same or equivalent functions may be accomplished by different embodiments that are also intended to be encompassed within the scope of the present disclosure. It is further understood that the use of relational terms such as first and second and the like are used solely to distinguish one from another entity without necessarily requiring or implying any actual such relationship or order between such entities.

Figure 1:
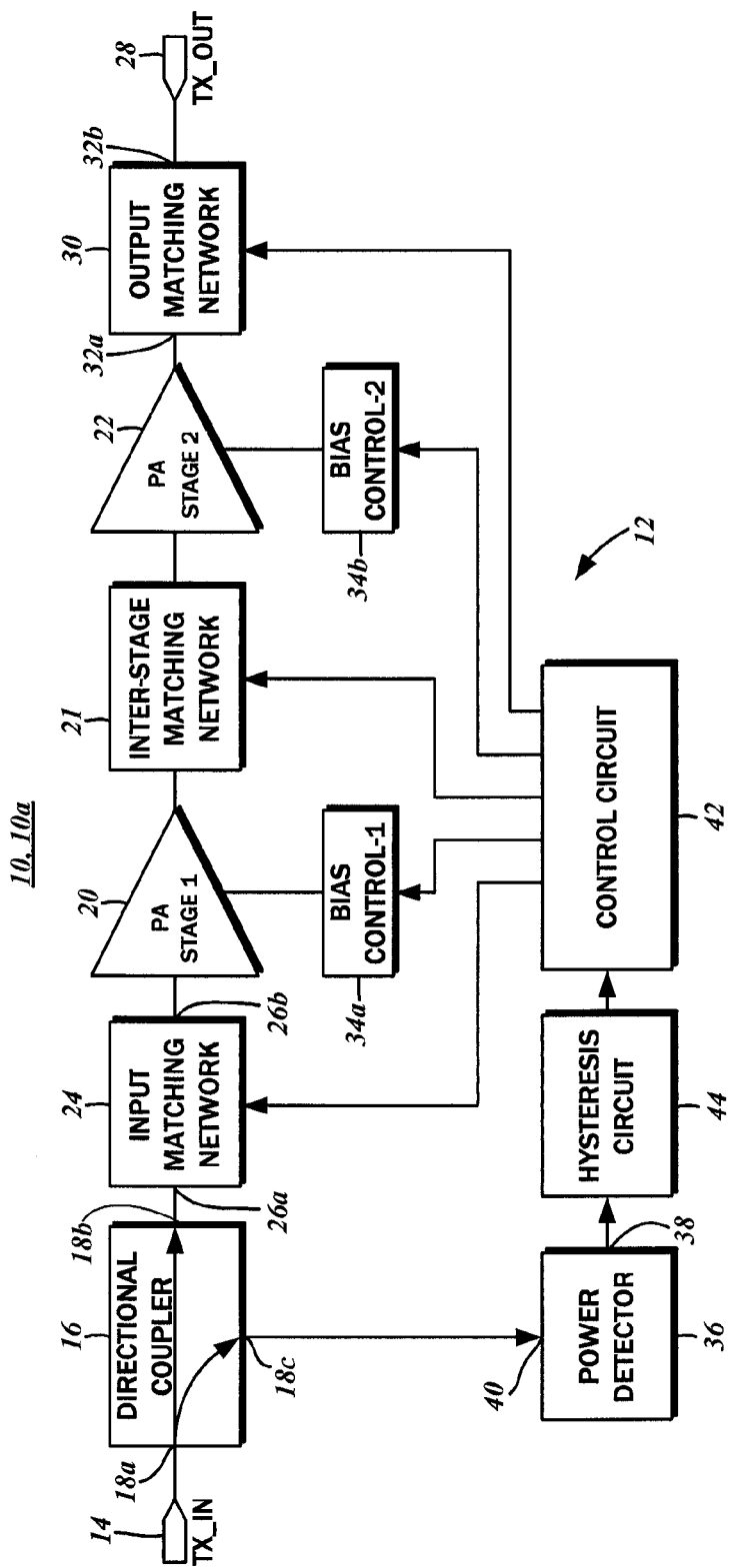
FIG. 1 is a block diagram illustrating one exemplary embodiment of a power amplifier with an input protection circuit.

The block diagram of FIG. 1 depicts an exemplary embodiment of a power amplifier circuit 10 including an input power protection circuit 12. Broadly, the input power protection circuit is understood to reduce gain in one or more power amplifier stages when an input transmit signal exceeds certain predefined limits that would overstress the amplifier transistors to such an extent that reliability is compromised. In further detail, the power amplifier circuit 10 includes a transmit signal input port 14, which may be connectable to an output from an RF transceiver. Additionally, the transmit signal input port 14 is connected to a directional coupler 16 defined by a first port 18a, a second port 18b, and a third port 18c. The first port 18a is connected to the transmit signal input port 14.

The transmit signal is the passed to both the second port 18b and the third port 18c in accordance with well-known operational principles of directional couplers. The directional coupler 16 may be implemented in various ways, such as that disclosed in co-pending U.S. patent application Ser. No. 14/251,197 filed Apr. 11, 2014 and entitled "MINIATURE RADIO FREQUENCY DIRECTIONAL COUPLER FOR CELLULAR APPLICATIONS," as well as U.S. patent application Ser. No. 13/333,706 filed Dec. 21, 2011, entitled "ON-DIE RADIO FREQUENCY DIRECTIONAL COUPLER," the entirety of the disclosures of which are wholly incorporated by reference herein.

In the illustrated embodiment, the exemplary first embodiment of the power amplifier circuit 10a includes a first power amplifier stage 20, as well as a second power amplifier stage 22. In between the first power amplifier stage 20 and the second power amplifier stage 22 is an inter-stage matching network 21. Although only two power amplifier stages 20, 22 are shown in the embodiment shown in FIG. 1 and others, it will be recognized by those having ordinary skill in the art that any number of amplifier stages may be utilized without departing from the scope of the present disclosure. The various features of the input power protection circuit 12 may be adapted for such alternative configurations of the power amplifier. Furthermore, while such features will be described in connection with specific embodiments of the power amplifier circuit 10, it is to be understood that those features are not necessarily limited to any particular embodiment, and may be adapted to any combination or sub-combination of elements that comprise the power amplifier circuit 10. The architectures disclosed herein may also be utilized in other amplifier circuits besides power amplifiers for the transmit chain, including low noise amplifiers in the receive chain, variable gain stages, programmable gain stages, buffer amplifiers, or any other gain block in a transceiver link. The power amplifier circuit 10 may be implemented with any semiconductor technology, though much of the circuit component protection benefits may be realized in CMOS-based devices. In this regard, in some embodiments, the components indicated as being part of the power amplifier circuit 10 may all be fabricated on a single semiconductor die, though this is by way of example only and not of limitation.

Interposed between the directional coupler 16 and the first power amplifier stage 20 is an input matching network 24 having a first transmit signal port 26a and a second transmit signal port 26b. In this regard, the second port 18b of the directional coupler 16 is connected to the first transmit signal port 26a, and the second transmit signal port 26b is connected to an input of the first power amplifier stage 20. The input matching network 24 is understood to impedance match the first power amplifier stage 20 to the transmit signal input port 14.

Along these lines, the output of the second power amplifier stage 22 is connected to a transmit signal output port 28, which may be connectible to an antenna, or additional transmit chain circuitry. Interposed between the second power amplifier stage 22 and the transmit signal output port 28 is an output matching network 30 with a first transmit signal port 32a connected to the output of the second power amplifier stage 22 and a second transmit signal port 32b connected to the transmit signal output port 28.

Each of the first power amplifier stage 20 and the second power amplifier stage 22 is controlled by separate bias control circuits 34, that is, a first bias control circuit 34a controls the first power amplifier stage 20, and a second bias control circuit 34b controls the second power amplifier stage 22. As will be described in further detail below, the bias control circuits 34 may be utilized to regulate gain of the power amplifier circuit 10.

The third port 18c of the directional coupler 16 is connected to a power detector 36. Forward power of the input signal on the transmit signal input port 14 is measured by the power detector 36, and generates an output voltage on an output port 38. This output voltage is understood to be proportional to the input power applied to an input port 40. It is understood that the input power level is independent of the input matching, and is consistent even without an exact 50 Ohm match. The output port 38 of the power detector 36 is connected to a control circuit 42, such that the measured value (which in the exemplary embodiment, is given as a proportional voltage) of the input power of the transmit signal is passed thereto. It is also possible to connect a hysteresis circuit 44 to the power detector 36 such that fluctuation in the response to the voltage signal by the control circuit 42 is reduced.

The control circuit 42 compared the voltage signal from the power detector 36 with pre-defined levels that are correlated to particular RF input signal power levels. In accordance with various embodiments detailed more fully below, the control circuit may generate a gain reduction signal to any one or more of the input matching network 24, the bias control circuits 34, the inter-stage matching network 21, and the output matching network 30. These components may be controlled with the gain reduction signal to reduce gain across the entire power amplifier/transmit chain, thereby reducing voltage and/or current overstress of the power amplifiers and the transistors thereof.

Figure 2:
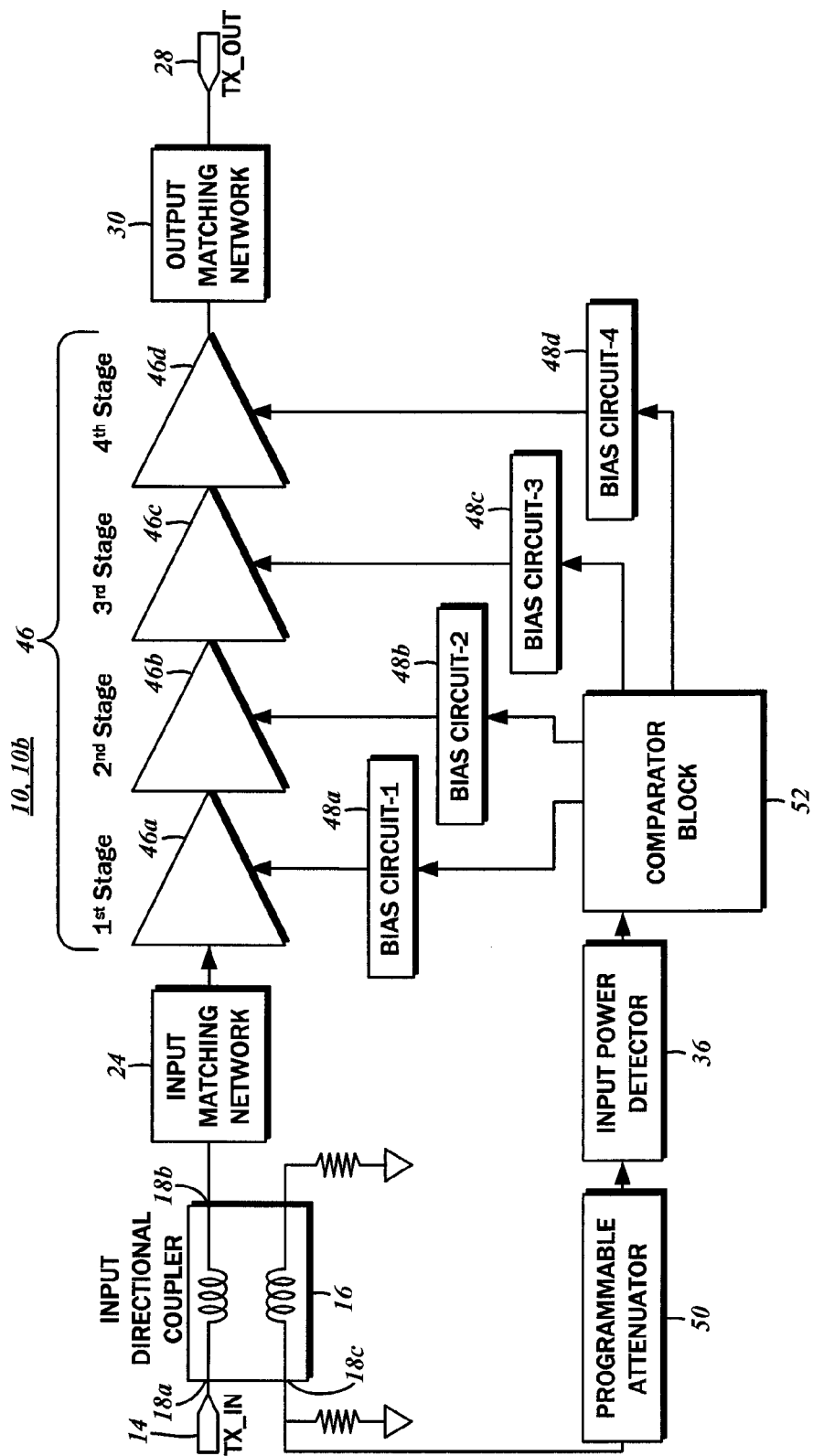
FIG. 2 is a block diagram of another exemplary embodiment of a bias control-based input power limiter for the power amplifier.

The block diagram of FIG. 2 is of a second embodiment 10b of the power amplifier circuit. Again, the transmit signal from the transceiver is passed to the power amplifier circuit 10 via the transmit signal input port 14. The input directional coupler 16, and specifically the first port 18a thereof, is connected to the transmit signal input port 14. The transmit signal is split between the second port 18b that is connected to the input matching network 24 and the third port 18c. The input directional coupler 16 may be a lumped component or an integrated solution that is implemented on the semiconductor substrate. The input matching network 24, in turn, is connected to a power amplifier 46 comprised of multiple stages, including a first stage 46a, a second stage 46b, a third stage 46c, and a fourth stage 46d. Each of the stages 46a-d is controlled by a separate bias circuit 48a-d, respectively. The output of the final power amplifier stage 46d is connected to the transmit signal output port 28 over the output matching network 30.

Generally, the transmit signal at the third port 18c is measured to evaluate whether the power level exceeds certain thresholds, and then using that evaluation to control the gain of the power amplifier. In further detail, the third port 18c of the input directional coupler 16 is connected to a programmable attenuator 50, which can be set to define a particular insertion loss. Alternatively, the particular configuration of the programmable attenuator 50 may be set by external (to the programmable attenuator 50) logic circuitry. A typical attenuator 50 is understood to include resistors, capacitors, and inductors that compensate for a coupling coefficient of the input directional coupler 16 over the operating frequency band.

The attenuated transmit signal is passed to the input power detector 36, which outputs a voltage corresponding to the detected power level of the transmit signal. This voltage is compared against a pre-programmed value by a comparator block 52. In one embodiment, when the voltage is higher the comparator block 52 outputs a "high" value to the bias control circuit 48. More particularly, this signal may be to the first bias circuit 48a that controls the first stage 46a of the power amplifier 46. The bias circuit 48 is understood to decrease quiescent current of the corresponding power amplifier 46, such that the gain thereof drops by a predetermined amount. In accordance with one implementation, the reduction in gain is approximately 2 dB to 6 dB.

It will be appreciated that the power level of the transmit signal reaching the final stage of the power amplifier 46 is dependent on the total gain of the previous amplifier stages in the chain. Thus, a drop in the overall gain of the power amplifier 46 corresponds to a reduced power level at the components, in particular, the transistors, of the later stages. These transistors are envisioned to be protected from overstress as a consequence of the overall reduced gain of the power amplifier 46.

According to various embodiments of the present disclosure, the interface between power detector 36 and the bias circuits 48, e.g., the comparator block 52, may be configured to handle multiple voltage levels corresponding to different power levels of the transmit signal. That is, multiple input power limits can be defined for controlling the bias conditions of each amplifier stage. It is understood that increasing transmit signal power levels may result in self-biasing of the power amplifier transistors, but with such multiple input power limits, the reduction in overall gain can be maintained over a wide range input power levels. In one embodiment, it is possible to accommodate different transmit signal power levels over a 10 dB range. For example, if the first limit of the input power Pin is 3 dBm, the bias circuit 48 may reduce the gain by 6 dB. However, if the input power increases to 9 dBm, a second voltage detector can trigger another gain reduction of 6 dB. Therefore, the maximum power reaching the final stage of the power amplifier 46 can be maintained at a consistent limit. It will be appreciated by those having ordinary skill in the art that the foregoing specifics as to power limits, gain reduction amounts, and the like are presented by way of example only and not of limitation, and may be modified to suit the particular needs of a given application.

Although the hysteresis circuit 44 was indicated for possible inclusion in the power amplifier circuit 10, if the power limits are set higher than the maximum normal operating power, such a hysteresis circuit 44 may not be required. Furthermore, without depending on a feedback circuit, the delay between the excess power conditions being detected and a response to reduce the gain of the power amplifier 46 is understood to be sufficiently short to protect the transistors from overstress.

Figure 3:
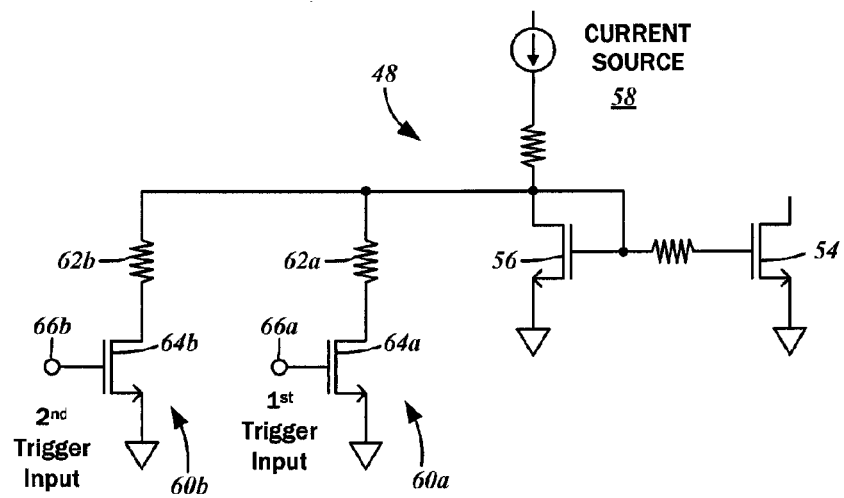
FIG. 3 is a schematic diagram of a bias circuit in accordance with one embodiment of the present disclosure.

Referring now to the schematic diagram of FIG. 3, one embodiment of the bias circuit 48 that sets multiple input power level limits is configured as a current mirror to a power transistor 54. Additionally, there is a mirror transistor 56, with a gate thereof being tied to the gate of the power transistor 54. A current source 58, together with a first shunt circuit 60a and a second shunt circuit 60b are also connected to the mirror transistor 56. The first shunt circuit 60a includes a first shunt resistor 62a and a first shunt transistor 64a triggered via a first input 66a. The second shunt circuit 60b includes a second shunt resistor 62b and a second shunt transistor 64b that is triggered via a second input 66b. When the first shunt transistor 64a is triggered, the first shunt resistor 62a shunts to gate of the power transistor 54 to ground, and shunts the mirror current. This is understood to reduce the gate bias voltage, along with the associated gain of the power amplifier stage. When the second shunt transistor 64b is trigger, the additional shunt resistor 62b is introduced between the gate of the power transistor 54 and ground, further reducing the gate bias voltage. The various transistors of the bias circuit 48 are depicted as NMOS (n-type metal oxide semiconductor) field effect transistors, though any other suitable transistor type may be substituted without departing from the present disclosure.

Figure 4:
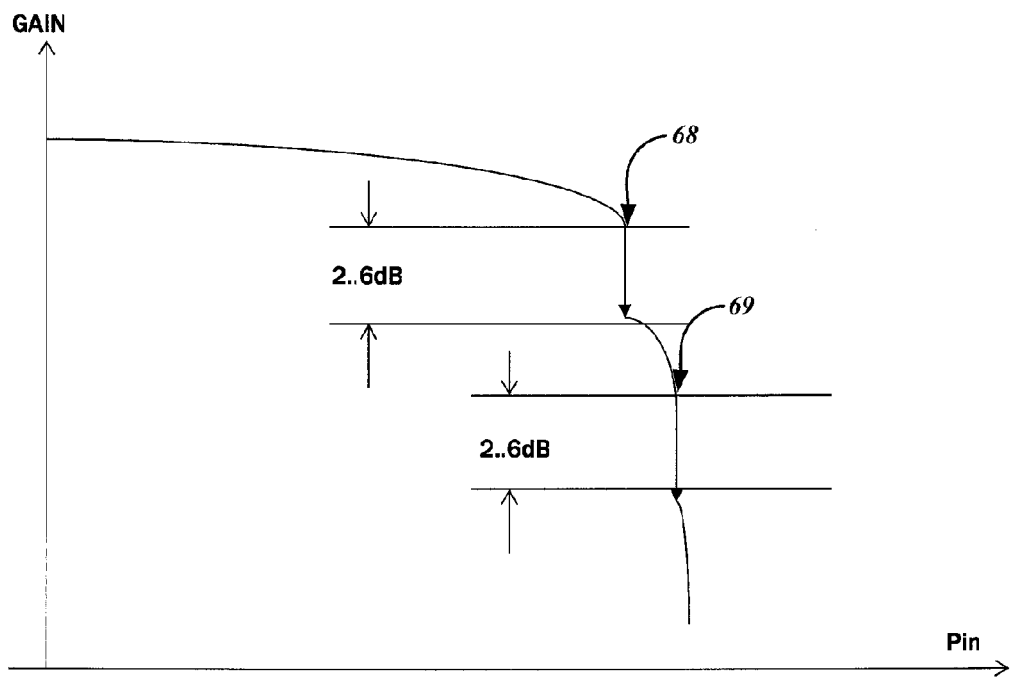
FIG. 4 is a graph showing a continuous-wave sweep applied to the power amplifier with the input protection circuit.

The graph of FIG. 4 best illustrates the performance of the aforementioned bias circuit 48. The graph plots a continuous wave sweep of the input power of the transmit signal provided to the power amplifier against the gain of the power amplifier stage with the bias circuit 48 in operation. As the input power increases to a first limit value 68, a sudden drop in gain is exhibited. When the input power increases to a second limit value 69, there is yet another drop in gain. By way of example, each gain reduction is understood to be in the range of 2 to 6 dB in one embodiment. The abrupt reduction in gain as shown is understood to result in non-linearity of the power amplifier circuit 10, so the power levels that trigger such gain reduction may be set well above the maximum normal operating input power, as indicated above.

Figure 5:
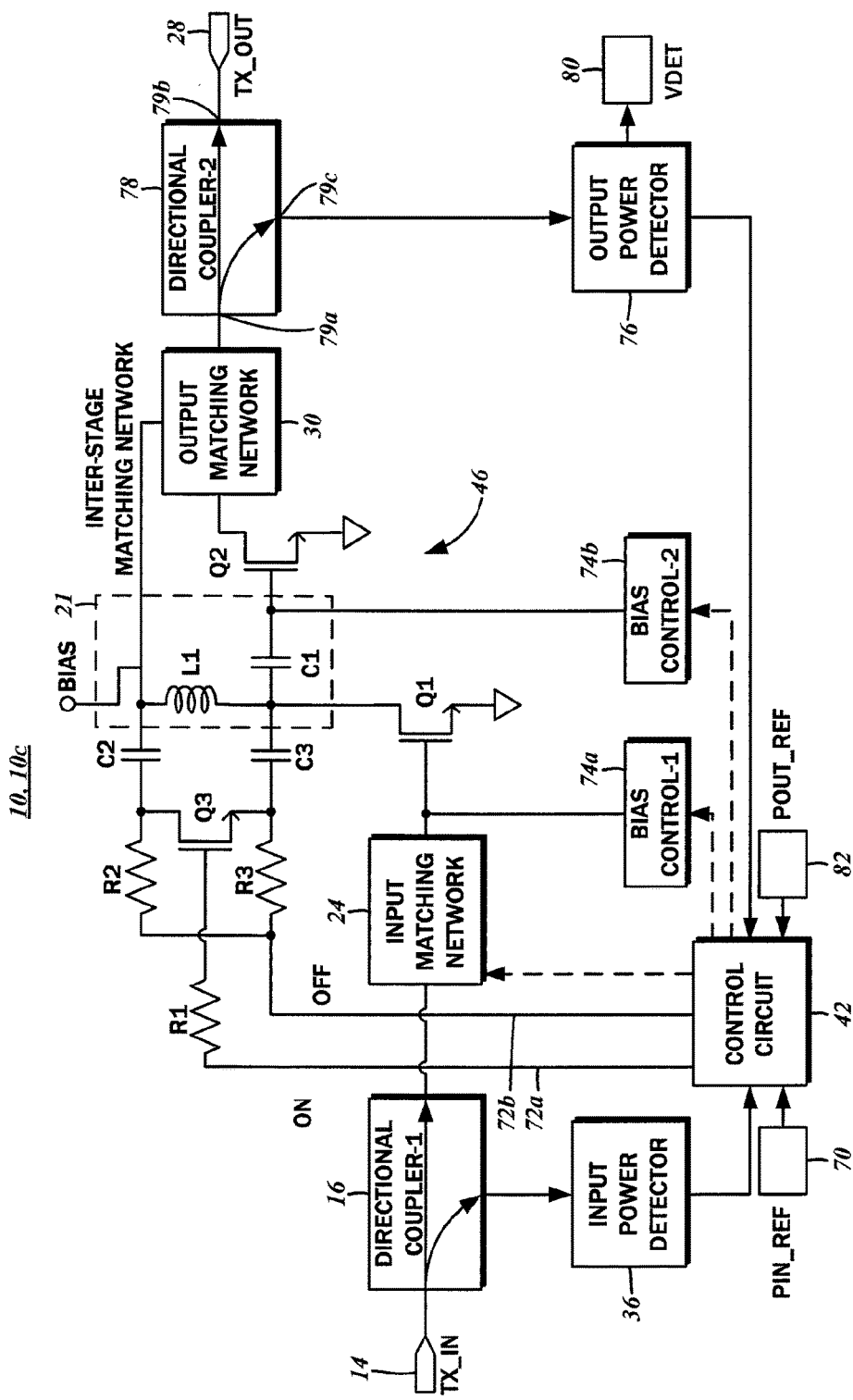
FIG. 5 is a schematic diagram of yet another embodiment of the power amplifier with the input protection circuit in which an inter-stage matching network is adjusted for controlling overall gain.

With reference to the schematic diagram of FIG. 5, another embodiment of the power amplifier circuit 10c contemplates the adjustment of gain with the inter-stage matching network 21. The transmit signal is provided via the transmit signal input port 14, which is then split to the input power detector 36 and the input matching network 24 by the input directional coupler 16 as discussed earlier. The power amplifier 46, in the illustrated example, is a two-stage implementation with a first stage transistor Q1 and a second stage transistor Q2. Again, although the transistors in the illustrated embodiment are of the NMOS type, any other suitable transistor type may be utilized instead. The gate of the first stage transistor Q1 is connected to the output of the input matching network 24, while the drain of the second stage transistor Q2 is connected to the input of the output matching network 30. The inter-stage matching network 21 is comprised of an inductor L1 and capacitor C1, when the power level of the transmit signal is below predefined limits and gain reduction modalities have not been activated by the control circuit 42.

As indicated above, the input power detector 36 generates a voltage output corresponding to the power level of the transmit signal as passed thereto. In one embodiment, the control circuit 42 compares such voltage output to an input reference PIN_REF 70, and can activate or deactivate a switching transistor Q3 based upon such comparison. The control circuit 42 has an output line 72a connected to the gate of the switching transistor Q3 through resistor R1, as well as an output line 72b connected to the drain and source of the switching transistor Q3 through resistors R2, R3, respectively. The input power detector 36 may be a peak envelope detector in accordance with various embodiments of the power amplifier circuit 10.

When the voltage output does not exceed the input reference 70, the switching transistor Q3 is in the off state as controlled via the output lines 72 and has a high impedance. Thus, the inductor L1 of the inter-stage matching network 21 is not loaded. To prevent shunting of the inductor L1 when the switching transistor Q3 is in the off state, the resistors R1, R2, and R3 have a high resistance value, e.g., greater than 10 kOhm.

When the voltage output exceeds the input reference 70, the switching transistor Q3 is in the on state, and has a low impedance. In one implementation, the reduced impedance may be around 2 to 5 Ohm. In this condition, capacitors C1 and C2 are in series with the small resistance of the switching transistor Q3 in the on state. Thus, a parallel chain with inductor L1 is defined, and so the impedance of the inter-stage matching network 21 is changed. This is understood to reduce the overall gain of the power amplifier 46.

In order to react quickly to the excess input power conditions, the various components of the input power protection circuit 12 are selected for a fast response. For instance, the control circuit 42 will preferably have a fast transient response time of under 100 nanoseconds. This, together with the fast switching transistor Q3, and the use of the envelope detector type power detector 36 is envisioned to address the protection requirements of the power amplifier transistors Q1 and Q2 from input power over-stress conditions.

Modifying the impedance of the inter-stage matching network 21 is one way to reduce the gain of the power amplifier circuit 10c. It is also possible for the control circuit 42 in this embodiment to control the bias circuits 74a, 74b that are connected to the gates of the first stage transistor Q1 and the second stage transistor Q2, respectively. The manner in which this is achieved has been described earlier in relation to other embodiments of the power amplifier circuit 10. The control circuit 42 may be used to likewise adjust the impedance of the input matching network 24 as well as the output matching network 30.

Referring still to the schematic diagram of FIG. 5, the power amplifier circuit 10c may also include an output power detector 76. The output of the power amplifier 46 is connected to an output directional coupler 78 via a first port 79a. A second port 79b is connected to the transmit signal output port 28, and a third port 79c is connected to the output power detector 76. Conventionally, the output power detector 76 may be utilized for control and monitoring by the transceiver and/or other circuitry external to the front end module. However, protection of the power amplifier circuit 10 from input power overstress is also contemplated, based upon measuring the forward power directed to the antenna by way of the output directional coupler 78. Similar to the input power detector 36, the output power detector 76 generates an output voltage corresponding to the power level of the transmit signal. This may be output as VDET 80, or passed to the control circuit 42, which compares the output voltage against an output reference POUT_REF 82. The control circuit 42 is understood to utilize the output voltage to regulate the gain of the inter-stage matching network 21, as well as the bias circuits 74, the input matching network 24, and the output matching network 30 as discussed above. The additional control made possible with the output power detector 76 is understood to protect the power amplifier circuit 10 from overstress when there is a large antenna Voltage Standing Wave Ratio (VSWR) variation.

Figure 6:
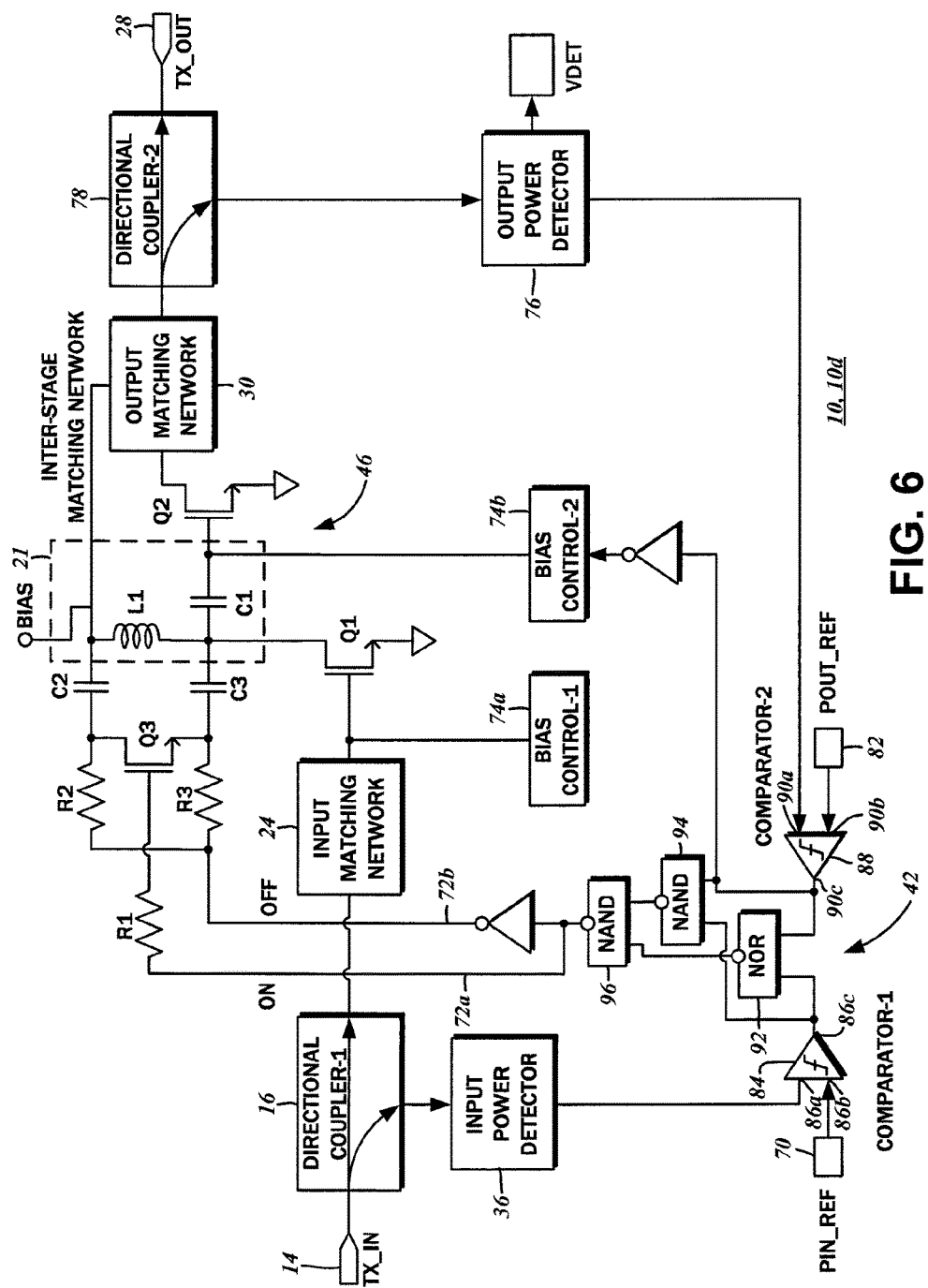
FIG. 6 is a schematic diagram of an embodiment of the power amplifier with the input protection circuit implemented with comparators and logic gates.

The schematic diagram of FIG. 6 is of another embodiment of the power amplifier circuit 10d, showing additional details of the control circuit 42. Otherwise, the remaining components are understood to be the same as that of the power amplifier circuit 10c shown in FIG. 5. In general, the transmit signal is passed to the transmit signal input port 14 and to the directional coupler 16. The transmit signal is provided to the input matching network 24 and to the input power detector 36 from the directional coupler 16. The input matching network 24 is connected to a multi-stage power amplifier 46 including a first stage transistor Q1 and a second stage transistor Q2 that are interconnected over the inter-stage matching network 21 that is controlled with a switching transistor Q3. The output of the power amplifier 46 is connected to the output matching network 30, and split to the transmit signal output port 28 and the output power detector 76 by way of the output directional coupler 78.

In accordance with various embodiments of the present disclosure, both readings from the input power detector 36 and the output power detector 76 are utilized to control the switching transistor Q3, though it is also possible to use only the input power detector 36 as described in relation to other embodiments of the power amplifier circuit 10. The control circuit 42 includes a first comparator 84 with a first input 86a connected to the output of the input power detector 36, and a second input 86b connected to the input reference 70. Additionally, there is a second comparator 88 with a first input 90a connected to the output of the output power detector 76, and a second input 90b connected to the output reference 82.

The first comparator 84 is understood to generate a logical "high" value at an output 86c when the voltage from the input power detector 36 exceeds that of the input reference 70, and a logical "low" value when not. Similarly, the second comparator 88 is understood to generate a logical "high" value at an output 90c when the voltage from the output power detector 76 exceeds that of the output reference 82, and a logical "low" value when not. The comparator outputs 86c, 90c are tied to a NOR logical gate 92, which generates a logical "high" only when both comparators 88, 90 output a logical "high." In all other conditions, a logical "low" is generated. The comparator outputs 86c, 90c are also tied to a first NAND logical gate 94, which outputs a logical "low" only when both comparators 88, 90 output a logical "high." Under all other conditions, a logical "high" is generated. The output of the NOR logical gate 92 and the first NAND logical gate 94 are tied to a second NAND logical gate 96. The output from the second NAND logical gate 96 corresponds to the switching transistor Q3 being turned on, while an inverse thereof corresponding to the switching transistor Q3 being turned off.

As mentioned above, the switching transistor Q3 is understood to control the impedance of the inter-stage matching network 21, thereby protecting the power amplifier transistors Q1 and Q2 from input power overstress. Additionally, the output power detector 76 can be utilized to detect VSWR variations at the antenna, and the control circuit 42 can modify the bias control current for the final amplification stage via the bias circuit 74b.

Figure 7:
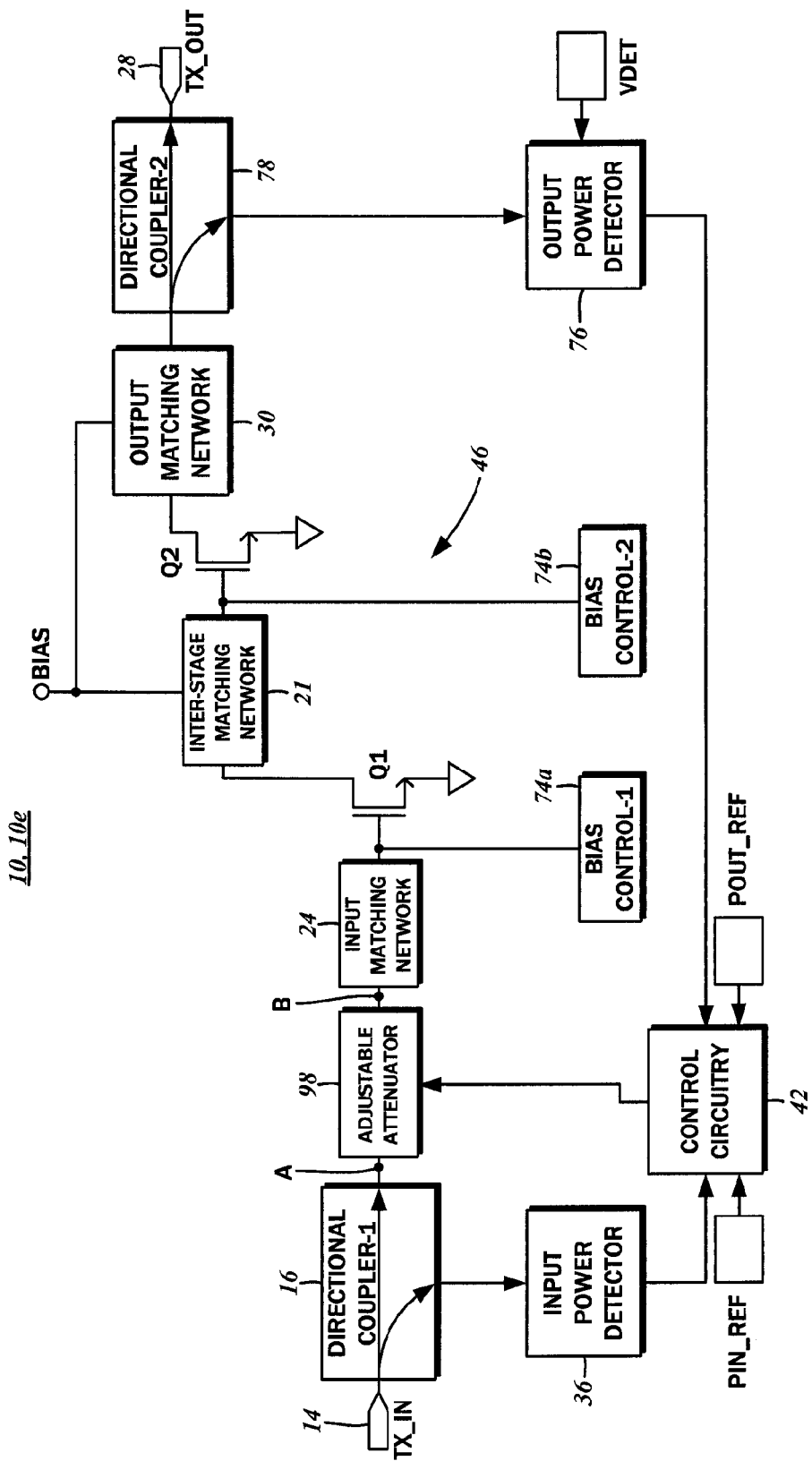
FIG. 7 is a blog diagram of another embodiment of the power amplifier with the input protection circuit including an adjustable attenuator.

Referring to the block diagram of FIG. 7, yet another embodiment of the power amplifier circuit 10e contemplates controlling gain with an adjustable attenuator 98. In other respects, the power amplifier circuit 10f is similar to other embodiments discussed above, for example, the transmit signal is passed to the transmit signal input port 14 and then to the directional coupler 16. The transmit signal is passed to the adjustable attenuator 98, and to the input power detector 36 from the directional coupler 16. From the adjustable attenuator 98, the transmit signal is passed to the input matching network 24, which is connected to a multi-stage power amplifier 46 including a first stage transistor Q1 and a second stage transistor Q2 that are interconnected over the inter-stage matching network 21. The output of the power amplifier 46 is connected to the output matching network 30, and split to the transmit signal output port 28 and the output power detector 76 by way of the output directional coupler 78.

Figure 8A:
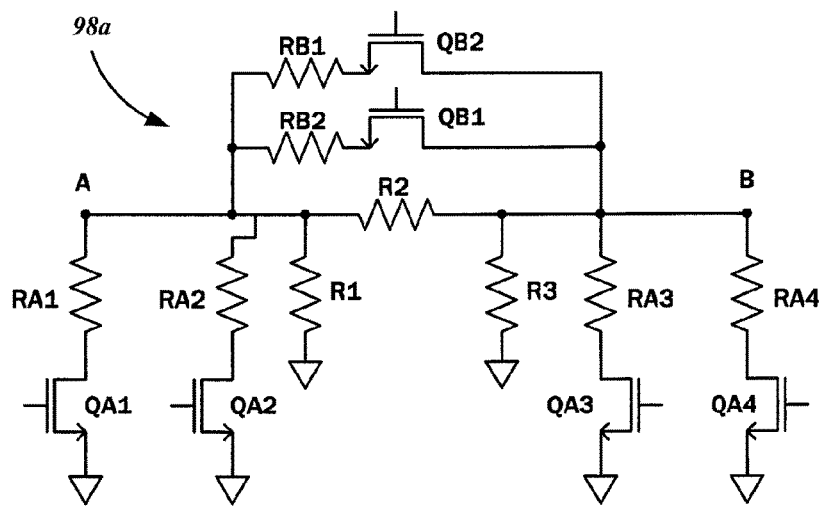
FIG. 8A is a schematic diagram of a Pi-type adjustable attenuator that may be utilized in the input protection circuit.
Figure 8B:
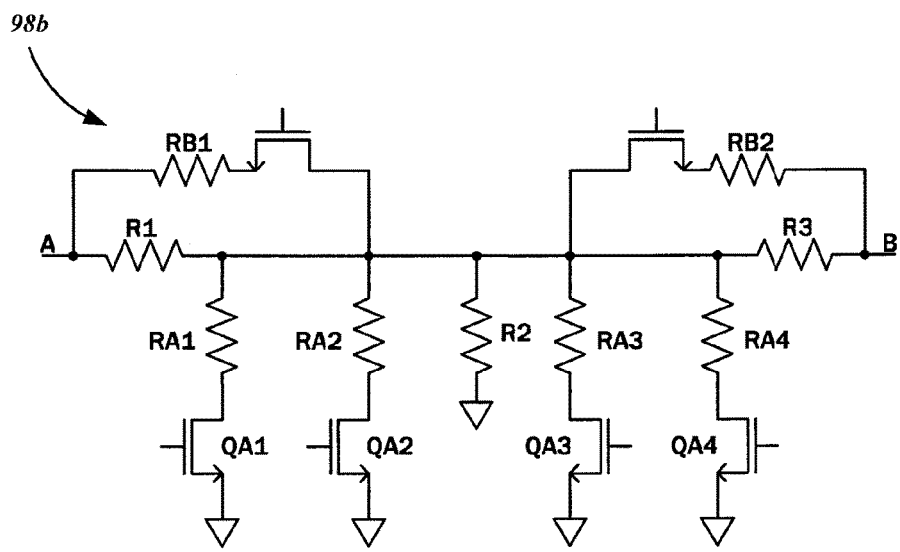
FIG. 8B is a schematic diagram of a T-type adjustable attenuator.

As noted, the adjustable attenuator 98 is positioned between a network node A and a network node B between the input directional coupler 16 and the input matching network 24. With reference to the schematic diagrams of FIG. 8A and FIG. 8B, one of the two embodiments of the adjustable attenuator 98a and 98b, respectively, can be utilized. The first adjustable attenuator 98a is known as a Pi-type attenuator, while the second adjustable attenuator is known as a T-type attenuator. The original attenuation is based upon the resistors R1, R2, and R3, when the transmit signal power levels are low and the switching transistors QA1, QA2, QA3, QB1, and QB2 are in the off state. When in this state, an impedance of greater than 10 kOhm may be defined. Different levels of attenuation may be set by selectively activating the switching transistors.

Figure 9:
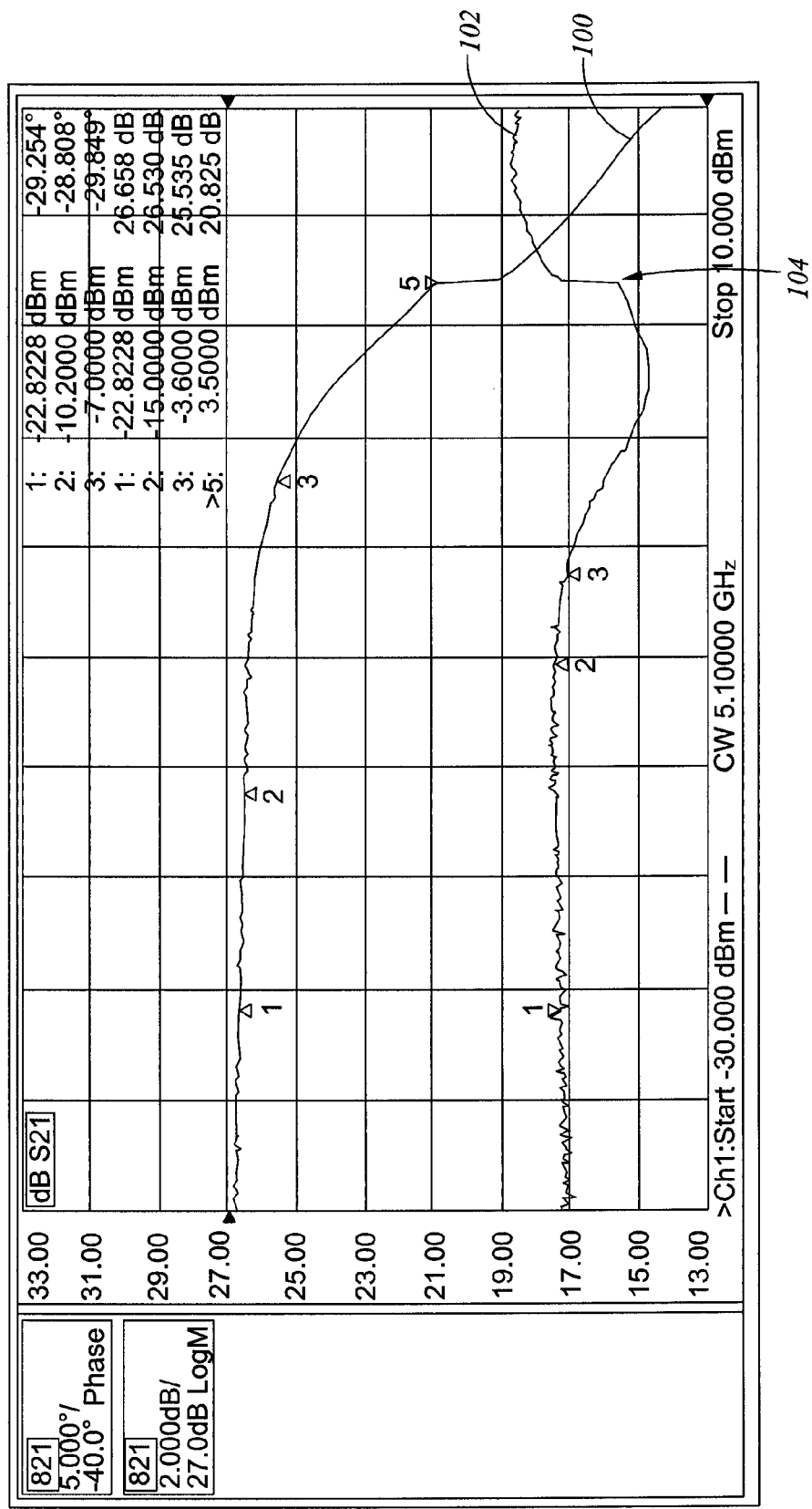
FIG. 9 is a graph plotting the gain (S21) at the 5.1 GHz operating frequency of an exemplary embodiment of the power amplifier with the input protection circuit.

The graph of FIG. 9 plots a measured gain magnitude and phase exhibited by an implementation of the power amplifier circuit 10 in accordance with the present disclosure. A first plot 100 is of the gain magnitude over a continuous wave sweep at the 5.1 GHz operating frequency across a range of transmit signal power levels, and a second plot 102 is of phase. At a threshold power limit 104, it is shown that the gain magnitude decreases by 2 dB when the transmit signal power level exceeds +3.5 dBm. This plot is understood to show the performance exhibited by a one-step bias control, which utilizes a single voltage trigger.

Figure 10:
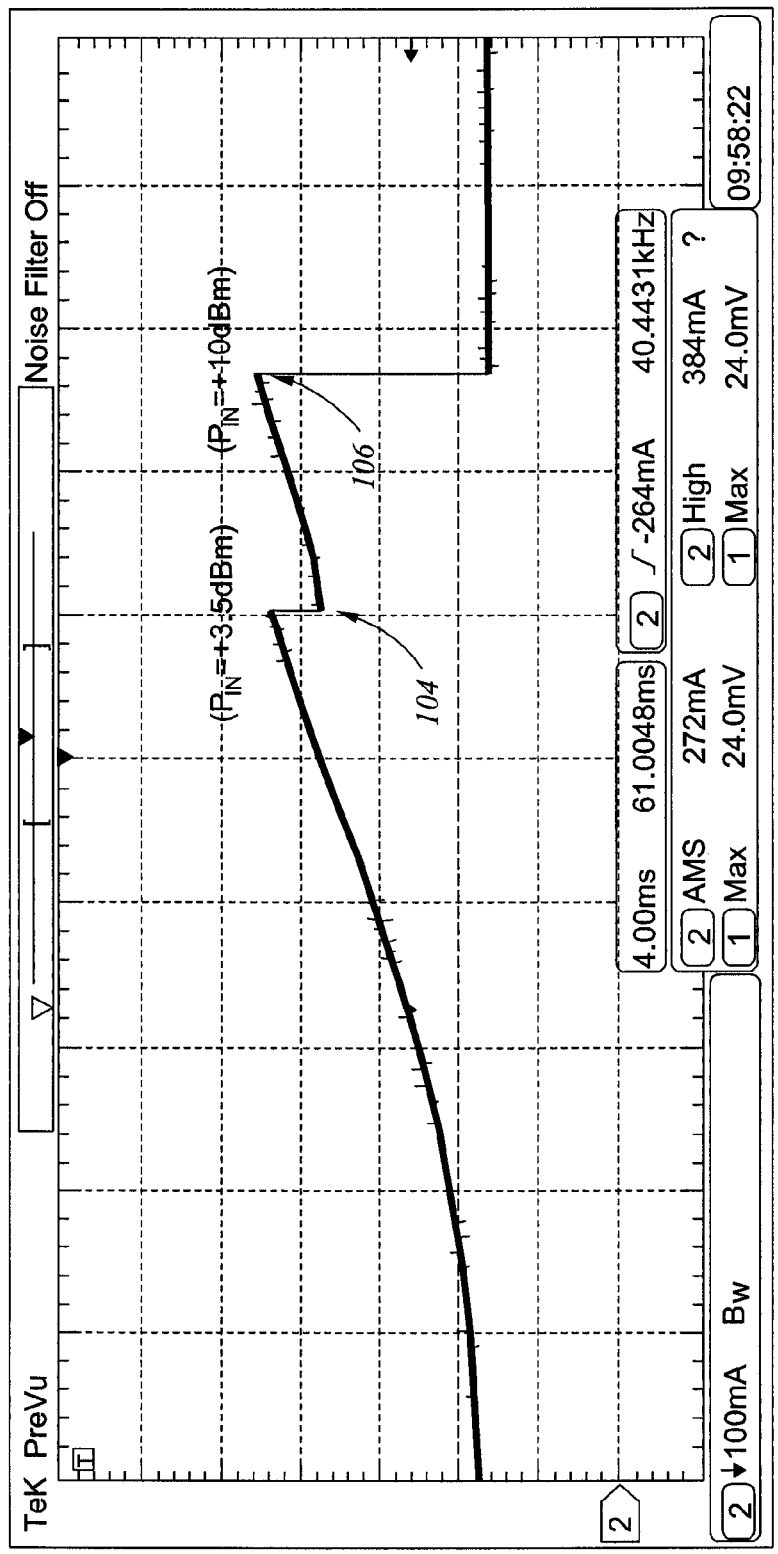
FIG. 10 is a graph plotting the DC current in a continuous wave input power sweep at the 5.1 GHz operating frequency applied to the power amplifier with the input protection circuit.

The graph of FIG. 10 plots a measured DC current over the same continuous wave sweep at the 5.1 GHz operating frequency across a range of transmit signal power levels. The gain limit is activated at a threshold transmit signal power level (exceeding +3.5 dBm) at plot position 104, and does not exceed the current limits even after the transmit signal power level exceeds +10 dBm at plot position 106. That is, the DC current when PIN is +10 dBm is substantially the same level as when PIN is +3.5 dBm.

Figure 11:
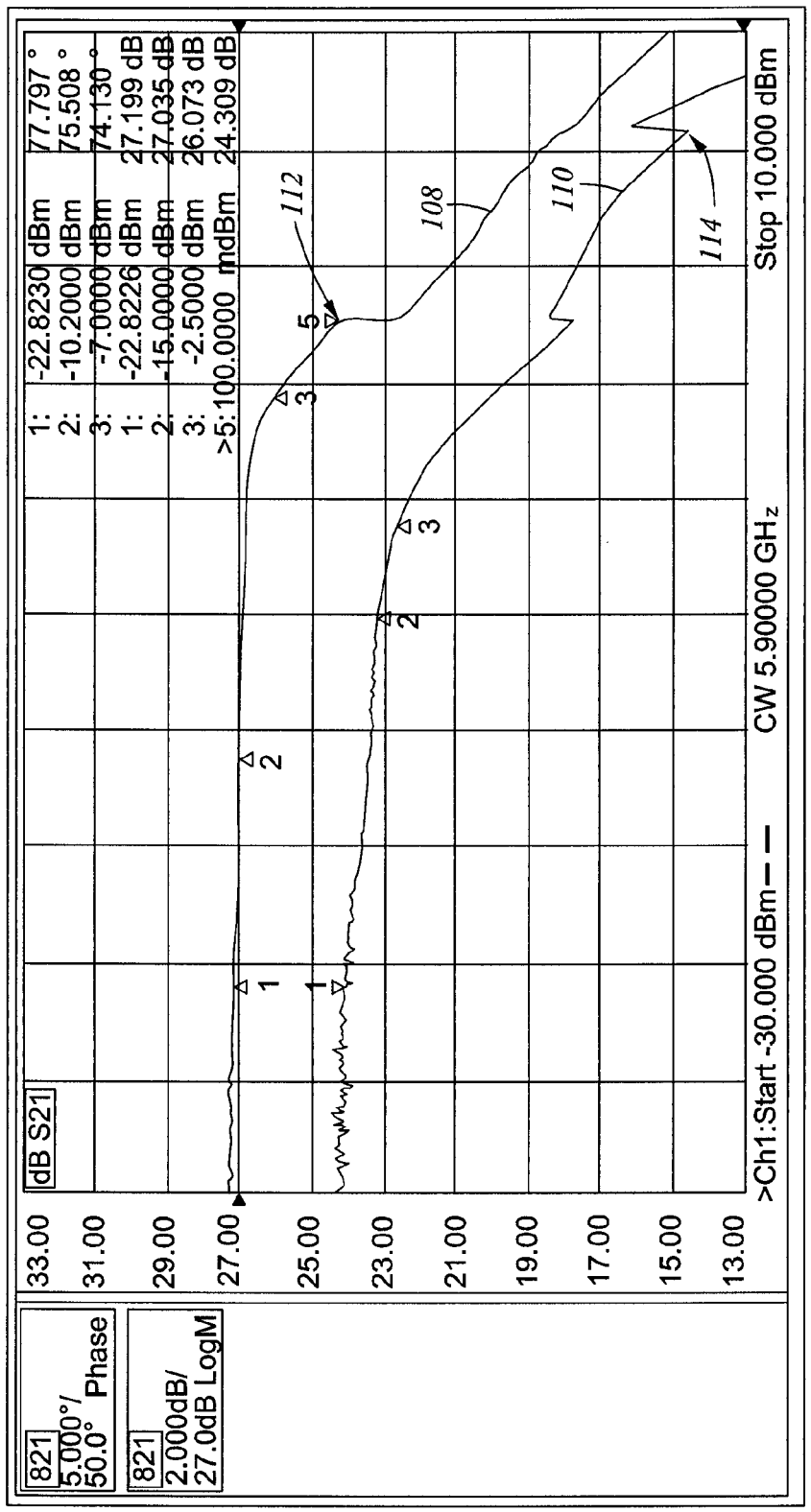
FIG. 11 is a graph plotting the gain (S21) at the 5.9 GHz operating frequency of an exemplary embodiment of the power amplifier with the input protection circuit.

The graph of FIG. 11 plots a measured gain magnitude and phase exhibited by another implementation of the power amplifier circuit 10 in accordance with the present disclosure. A first plot 108 is of the gain magnitude over a continuous wave sweep at the 5.9 GHz operating frequency across a range of transmit signal power levels, and a second plot 110 is of the phase. At a first threshold power limit 112, it is shown that the gain magnitude decreases by 2 dB when the transmit signal power level exceeds +0.1 dBm. Then, at a second threshold power limit 114, e.g., +8.5 dBm, a second bias control step occurs. Since the power amplifier 46 is already in saturation, the gain step is approximately 0.5 dB. The graph shows the performance exhibited by a two-step bias control, which utilizes two voltage trigger, one at +0.1 dBm, and another at +8.5 dBm.

Figure 12:
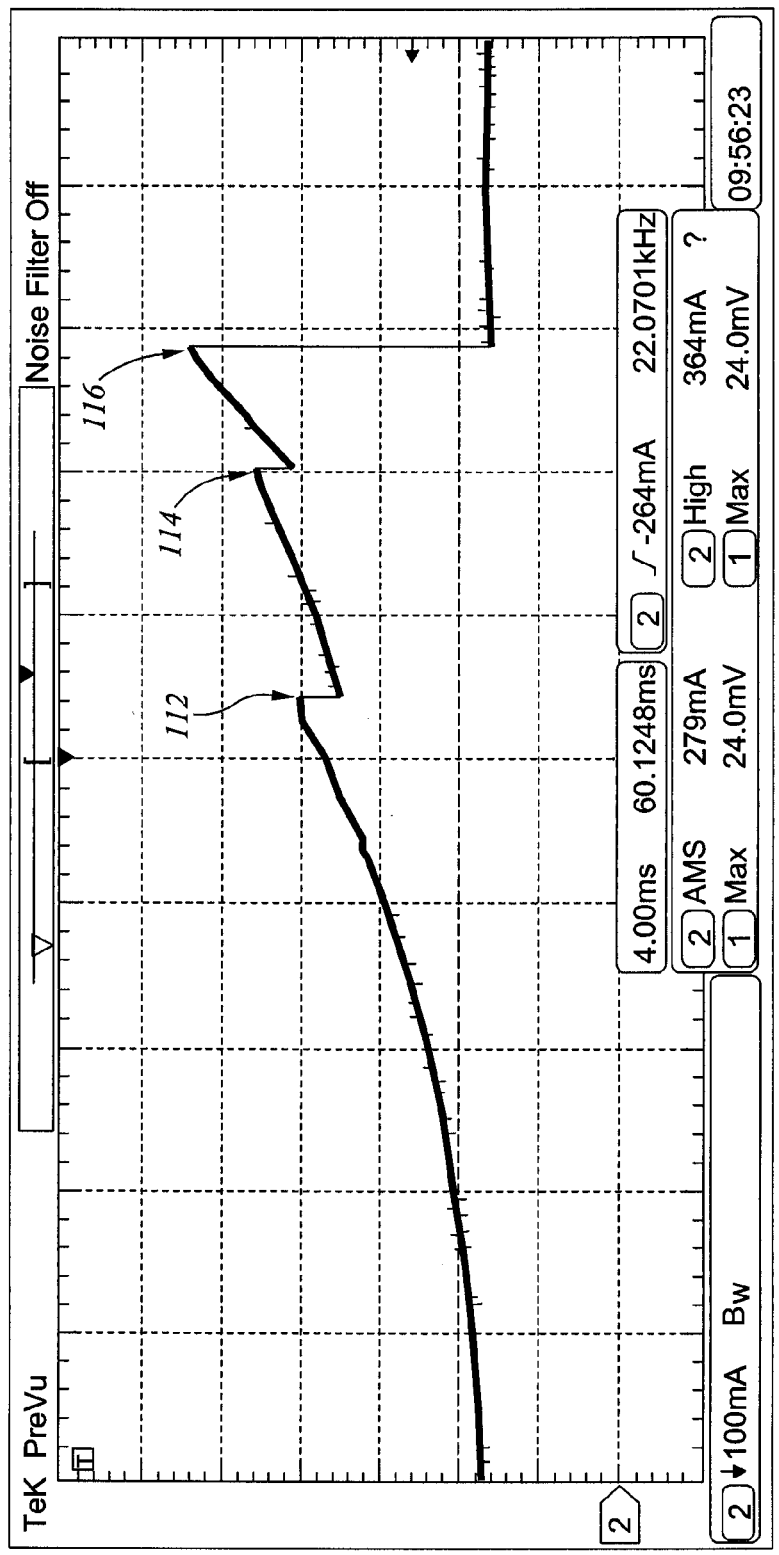
FIG. 12 is a graph plotting the DC current in a continuous wave input power sweep at the 5.9 GHz operating frequency applied to the power amplifier with the input protection circuit.

The graph of FIG. 12 plots a measured DC current over the same continuous wave sweep at the 5.9 GHz operating frequency across a range of transmit signal power levels. The gain limit is activated at a first threshold transmit signal power level (exceeding +0.1 dBm) at the plot position 112, and another at a second threshold transmit signal power level (exceeding +8.5 dBm) at the plot position 114. The current limits are not exceeded even after the transmit signal power level exceeds +10 dBm at plot position 116. It will be appreciated that without controlling the gain, the power amplifier transistors are likely to result in destruction with over 700 mA of DC current.

Figure 13:
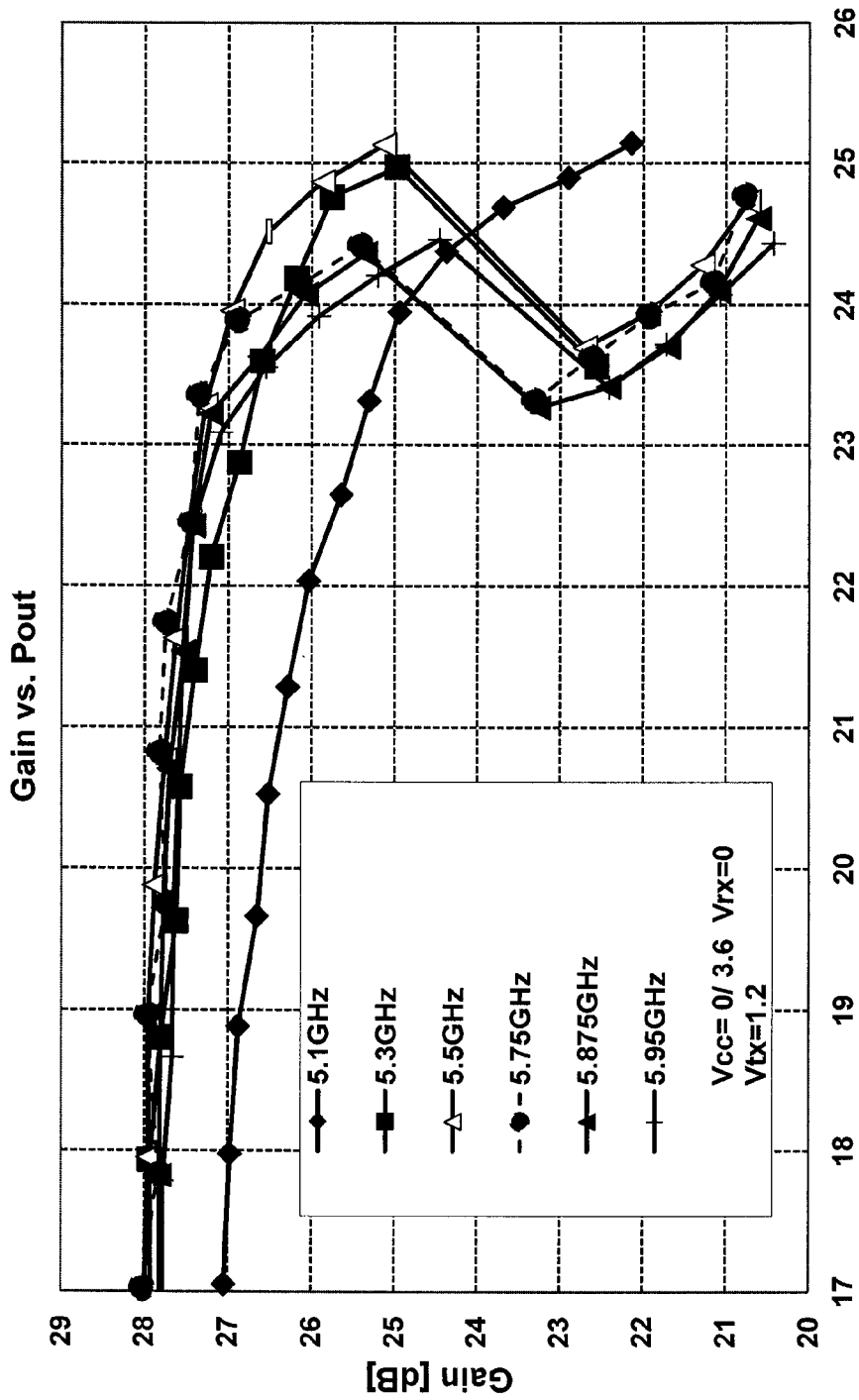
FIG. 13 is a graph plotting gain (S21) versus output power in a continuous wave input power sweep at various operating frequencies between 5.1 GHz and 5.9 GHz.
Figure 14:
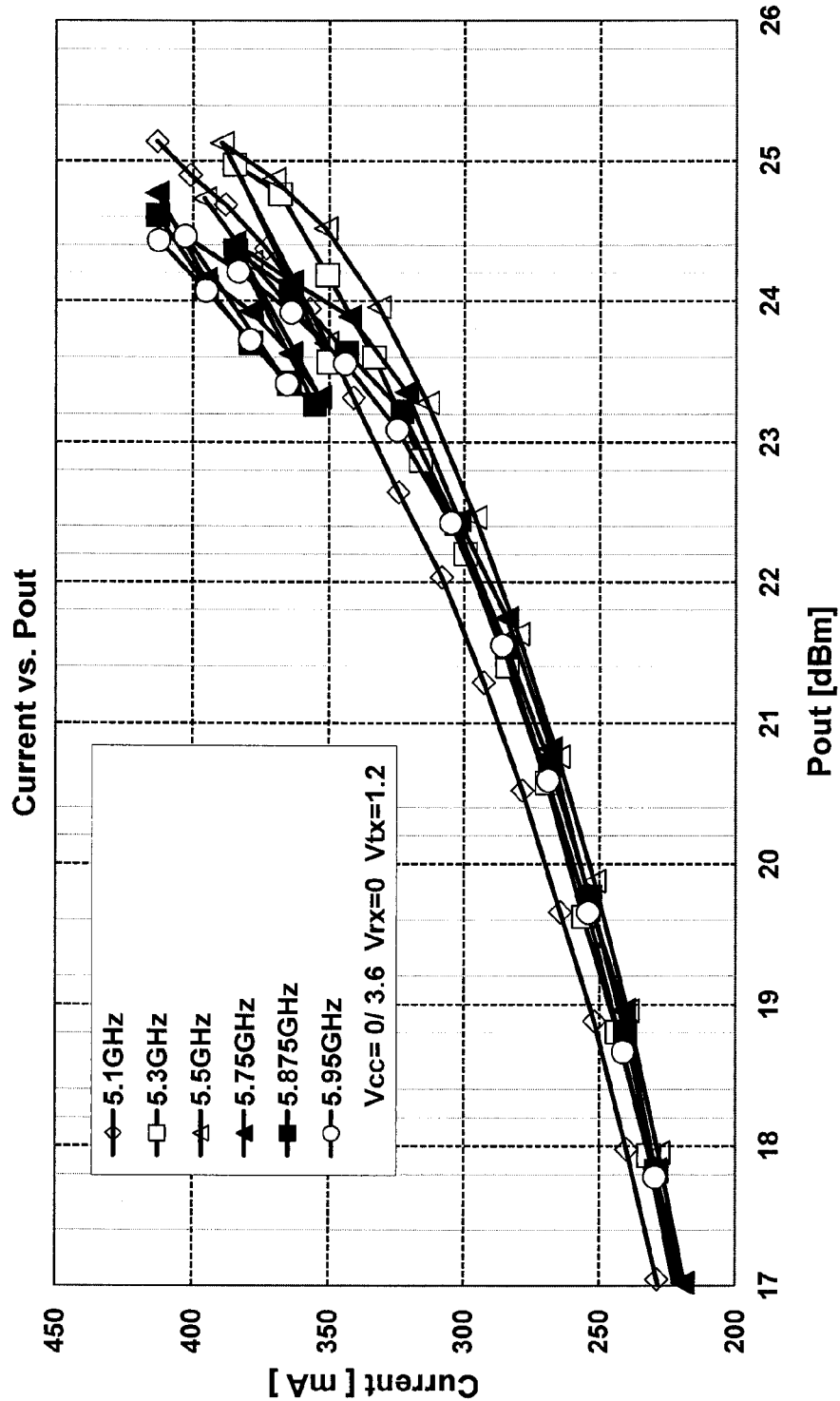
FIG. 14 is a graph plotting DC current versus output power in a continuous wave input power sweep at various operating frequencies between 5.1 GHz and 5.9 GHz.

The graph of FIG. 13 plots measured gain of the power amplifier circuit 10 at various operating frequencies ranging from 5.1 GHz to 5.9 GHz over a continuous wave input power sweep. Along these lines, the graph of FIG. 14 plots measured DC current at the same operating frequencies over the same continuous wave input power sweep. These graphs illustrate the contemplated performance of the power amplifier circuit 10, in which gain and DC current to the power amplifiers 46 is reduced when the transmit signal power level exceeds a predefined threshold so that the circuit components can be protected from overstress.

The particulars shown herein are by way of example and only for purposes of illustrative discussion of the embodiments of the power amplifiers with input power protection circuits. The features are presented in the cause of providing what is believed to be the most useful and readily understood description of the principles and conceptual aspects. In this regard, no attempt is made to show details with more particularity than is necessary, the description taken with the drawings making apparent to those skilled in the art how the several forms of the present disclosure may be embodied in practice.

What is claimed is:
1. An input power limiter circuit for a power amplifier comprising:
   an input matching network;
   an output matching network;
   a plurality of chained amplifier stages each controlled by a bias circuit, a first one of the chained amplifier stages being connected to the input matching network and a last one of the chained amplifier stages being connected to the output matching network;
   a directional coupler connected to a transmit signal input and the input matching network;
   a programmable attenuator connected to the directional coupler;
   an input power detector connected to the programmable attenuator; and
   a comparator block connected to the input power detector and to each of the bias circuits of the chained amplifier stages, the bias circuits decreasing quiescent current of the respective chained amplifier stages in response to the input power detector triggering a high input power indicator.

2. The circuit of claim 1 wherein the high input power indicator is triggered at an input signal power level exceeding predefined normal operating levels.

3. The circuit of claim 1 wherein the high input power indicator is defined by a plurality of voltage levels, gain of a first one of the chained amplifier stages being reduced by a first degree based upon a first voltage level of the high input power indicator, and by a second degree based upon a second voltage level of the high input power indicator.

4. The circuit of claim 3 wherein the bias circuit of the first one of the chained amplifier stages includes:
a mirror transistor connected to a power transistor defining the first one of the chained amplifier stages;
a first shunting circuit including a first shunt transistor and a first shunt resistor, the first shunt transistor being triggered at the first voltage level of the high input power indicator; and
a second shunting circuit including a second shunt transistor and a second shunt resistor, the second shunt transistor being triggered at the second voltage level of the high input power indicator.

5. The circuit of claim 1 wherein the input matching network, the output matching network, the chained amplifier stages, the directional coupler, the programmable attenuator, the input power detector, and the comparator block are fabricated on a single semiconductor die.

6. An input power limiter circuit for a power amplifier comprising:
an input directional coupler connected to a transmit signal input;
a power amplifier stage connected to the input directional coupler;
an adjustable attenuator connected to the input directional coupler and the power amplifier stage;
an input power detector generating a voltage output proportional to a power level of an input signal;
a control circuit connected to the input power detector and the adjustable attenuator, an attenuation factor thereof being increased based at least in part on an evaluation of the voltage output from the input power detector exceeding a predefined threshold provided as an independent input power reference voltage to the control circuit and defined relative to corresponding voltage levels output by the input power detector, and gain of the power amplifier stage being reduced in response to the increased attenuation factor.

7. The circuit of claim 6 wherein the adjustable attenuator is a Pi-type attenuator circuit.

8. The circuit of claim 6 wherein the adjustable attenuator is a T-type attenuator circuit.

9. The circuit of claim 6 wherein the input directional coupler, the power amplifier stage, the adjustable attenuator, the input power detector, and the control circuit are fabricated on a single semiconductor die.

10. The circuit of claim 1 further comprising a hysteresis circuit connected to the input power detector.

11. The circuit of claim 1 wherein the comparator block is connected to the input matching network and the input matching network reduces impedance in response to the input power detector triggering the high input power indicator.

12. The circuit of claim 1 further comprising:
an output directional coupler connected to the output matching network and to a transmit signal output; and
an output power detector generating a voltage output proportional to a power level of an output signal on the transmit signal output.

13. The circuit of claim 12 wherein the comparator block is connected to the input matching network and the input matching network reduces impedance based upon a comparison of a voltage output from the output power detector to an output reference.

14. The circuit of claim 12 wherein the comparator block is connected to the output matching network and the output matching network reduces impedance based upon a comparison of a voltage output from the output power detector to an output reference.

15. The circuit of claim 12 wherein the bias circuit that controls the last one of the chained amplifier stages modifies a bias control current for the last one of the chained amplifier stages based upon a comparison of a voltage output from the output power detector to an output reference.

16. The circuit of claim 1 wherein the input power detector is a peak envelope detector.

17. The circuit of claim 6 further comprising an output matching network, and an output directional coupler connected to the output matching network and to a transmit signal output; and
an output power detector generating a voltage output proportional to a power level of an output signal on the transmit signal output.

18. The circuit of claim 17 wherein the attenuation factor of the adjustable attenuator is adjusted based at least in part on a comparison of a voltage output from the output power detector to an output reference.

19. The circuit of claim 16 wherein the attenuation factor is increased at an input signal power level exceeding predefined normal operating levels.

20. An input power limiter circuit for a power amplifier comprising:
an input directional coupler connected to a transmit signal input;
a power amplifier stage connected to the input directional coupler;
an adjustable attenuator connected to the input directional coupler and the power amplifier stage;
an input power detector generating a first voltage output proportional to a power level of an input signal;
an output directional coupler connected to a transmit signal output and the power amplifier stage;
an output power detector generating a second voltage output proportional to a power level of an output signal;
a control circuit connected to the input power detector and the adjustable attenuator, an attenuation factor thereof being modified at least in part on a continuous independent evaluation of the first voltage output from the input power detector exceeding a first predefined threshold provided as an input power reference voltage, and continuous independent evaluation of the second voltage output from the output power detector exceeding a second predefined threshold provided as an output power reference voltage, gain of the power amplifier stage being continusllly adjusted in response to the modified attenuation factor.

* * * * *